(12) United States Patent
Chen

(10) Patent No.: US 9,536,833 B2
(45) Date of Patent: Jan. 3, 2017

(54) SEMICONDUCTOR DEVICE ALLOWING METAL LAYER ROUTING FORMED DIRECTLY UNDER METAL PAD

(71) Applicant: MEDIATEK INC., Hsin-Chu (TW)

(72) Inventor: Chun-Liang Chen, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/164,889

(22) Filed: May 26, 2016

(65) Prior Publication Data

US 2016/0268202 A1 Sep. 15, 2016

Related U.S. Application Data

(63) Continuation-in-part of application No. 14/165,594, filed on Jan. 28, 2014.

(60) Provisional application No. 62/204,160, filed on Aug. 12, 2015, provisional application No. 61/759,497, filed on Feb. 1, 2013.

(51) Int. Cl.
*H01L 23/52* (2006.01)
*H01L 23/528* (2006.01)
*H01L 27/088* (2006.01)
*H01L 23/522* (2006.01)

(52) U.S. Cl.
CPC ....... *H01L 23/5286* (2013.01); *H01L 23/5226* (2013.01); *H01L 23/5283* (2013.01); *H01L 27/088* (2013.01)

(58) Field of Classification Search
CPC ............... H01L 23/5286; H01L 27/088; H01L 23/5226; H01L 23/5283
See application file for complete search history.

(56) References Cited

U.S. PATENT DOCUMENTS

| 5,272,600 | A  | * | 12/1993 | Carey | H01L 23/5384 174/255 |
| 5,629,838 | A  |   | 5/1997  | Knight | |
| 6,191,023 | B1 | * | 2/2001  | Chen  | H01L 24/03 257/E21.508 |
| 6,305,000 | B1 |   | 10/2001 | Phan  | |
| 6,350,667 | B1 | * | 2/2002  | Chen  | H01L 21/76843 257/E21.508 |
| 6,583,040 | B1 | * | 6/2003  | Lin   | H01L 21/4853 438/107 |
| 6,777,318 | B2 | * | 8/2004  | Jeng  | H01L 21/76838 257/E21.582 |
| 7,094,676 | B1 | * | 8/2006  | Leu   | H01L 23/3128 257/E23.178 |

(Continued)

FOREIGN PATENT DOCUMENTS

CN 1639865 7/2005

*Primary Examiner* — Nicholas Tobergte
(74) *Attorney, Agent, or Firm* — Winston Hsu; Scott Margo

(57) ABSTRACT

A semiconductor device may include a metal pad and a first specific metal layer routing. The metal pad is positioned on a first metal layer of the semiconductor device and is directly contacting the first metal layer. The first specific metal layer routing is formed on a second metal layer of the semiconductor device and under the metal pad. In addition, the semiconductor device may include at least one via plug for connecting the first specific metal layer routing to at least one metal region in the first metal layer, where the aforementioned at least one via plug is formed directly under the metal pad.

17 Claims, 8 Drawing Sheets

(56) References Cited

U.S. PATENT DOCUMENTS

| | | |
|---|---|---|
| 7,791,210 B2 * | 9/2010 | Miller ............... H01L 23/49838 |
| | | 257/690 |
| 2003/0173668 A1 | 9/2003 | Downey |
| 2007/0063352 A1 | 3/2007 | Archer |
| 2007/0096320 A1 * | 5/2007 | Takemura ............... H01L 24/05 |
| | | 257/751 |
| 2010/0246152 A1 | 9/2010 | Lin |
| 2011/0049721 A1 | 3/2011 | Koti |
| 2014/0035095 A1 | 2/2014 | Lin |

* cited by examiner

US 9,536,833 B2

SEMICONDUCTOR DEVICE ALLOWING METAL LAYER ROUTING FORMED DIRECTLY UNDER METAL PAD

CROSS REFERENCE TO RELATED APPLICATION

This application claims the benefit of U.S. Provisional Application No. 62/204,160, which was filed on Aug. 12, 2015, and is included herein by reference. In addition, this application is a continuation in part application and claims the benefit of U.S. Non-provisional application Ser. No. 14/165,594, which was filed on Jan. 28, 2014 and is included herein by reference. The U.S. Non-provisional application Ser. No. 14/165,594 claims the benefit of U.S. Provisional Application No. 61/759,497, which was filed on Feb. 1, 2013.

BACKGROUND

The disclosed embodiments of the present invention relate to a semiconductor device, and more particularly, to a semiconductor device which can allow a metal layer routing formed directly under a metal pad.

Please refer to FIG. 1. FIG. 1 is a simplified top-view diagram of a conventional semiconductor device 100, wherein the semiconductor device 100 can be a chip. As shown in FIG. 1, the semiconductor device 100 comprises: a metal pad 102, a power line 104, and a ground line 106. However, the power line 104 and a ground line 106 can not be formed under the metal pad 102, and thus the semiconductor device 100 has a problem of requiring a large layout area for the power line 104 and a ground line 106.

SUMMARY

In accordance with exemplary embodiments of the present invention, a semiconductor device is proposed to solve the above-mentioned problem.

According to an aspect of the present invention, an exemplary semiconductor device is disclosed. The semiconductor device comprises: a metal pad and a first specific metal layer routing. The metal pad is positioned on a first metal layer of the semiconductor device. The first specific metal layer routing is formed on a second metal layer of the semiconductor device, and directly under the metal pad.

According to an aspect of the present invention, an exemplary semiconductor device is disclosed. The semiconductor device may comprise a metal pad and a first specific metal layer routing. The metal pad is positioned on a first metal layer of the semiconductor device and is directly contacting the first metal layer. The first specific metal layer routing is formed on a second metal layer of the semiconductor device and under the metal pad. In addition, the semiconductor device may comprise at least one via plug (e.g. one or more via plugs, such as a plurality of via plugs) for connecting the first specific metal layer routing to at least one metal region (e.g. one or more metal regions) in the first metal layer, where the aforementioned at least one via plug is formed directly under the metal pad.

Briefly summarized, compared with prior art, since the semiconductor device disclosed by the present invention can allow a metal layer routing formed directly under a metal pad, the layout area size of the semiconductor device can be reduced effectively.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

Figure 1:
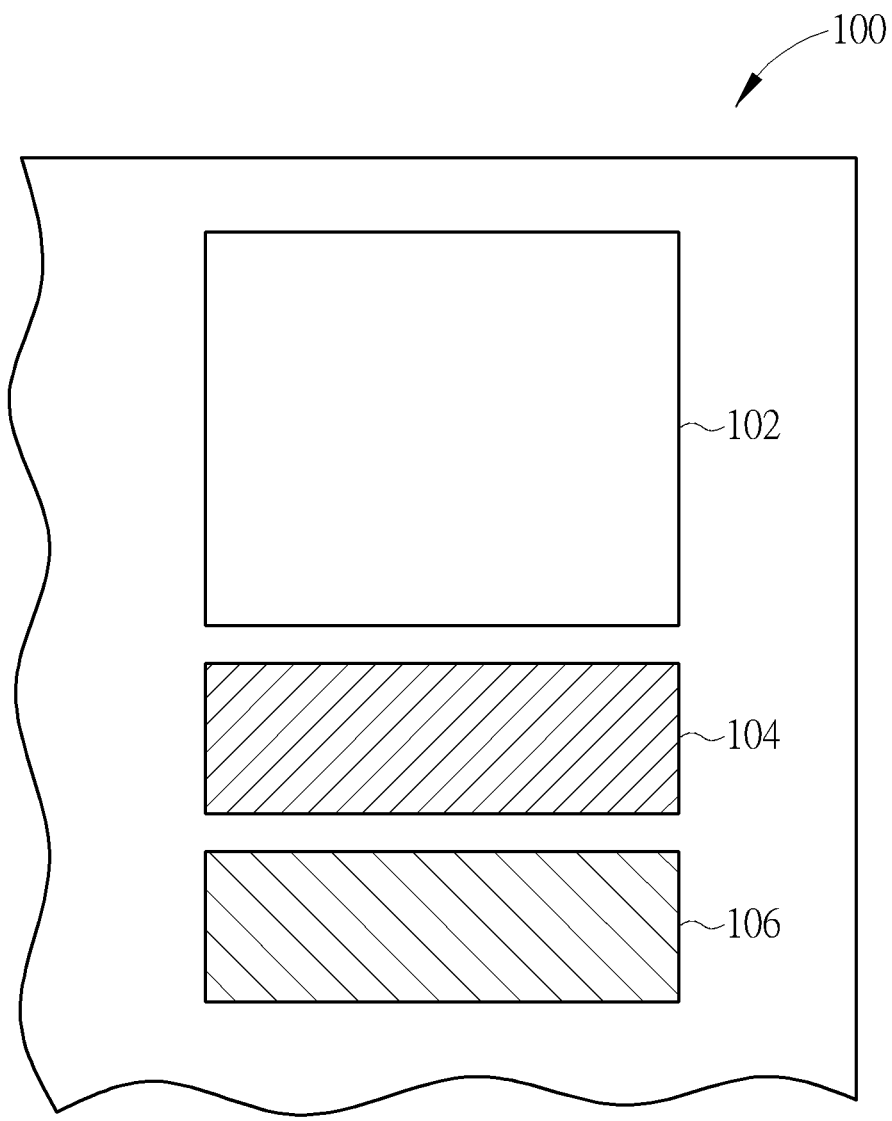
FIG. 1 is a simplified top-view diagram of a conventional semiconductor device.
Figure 2:
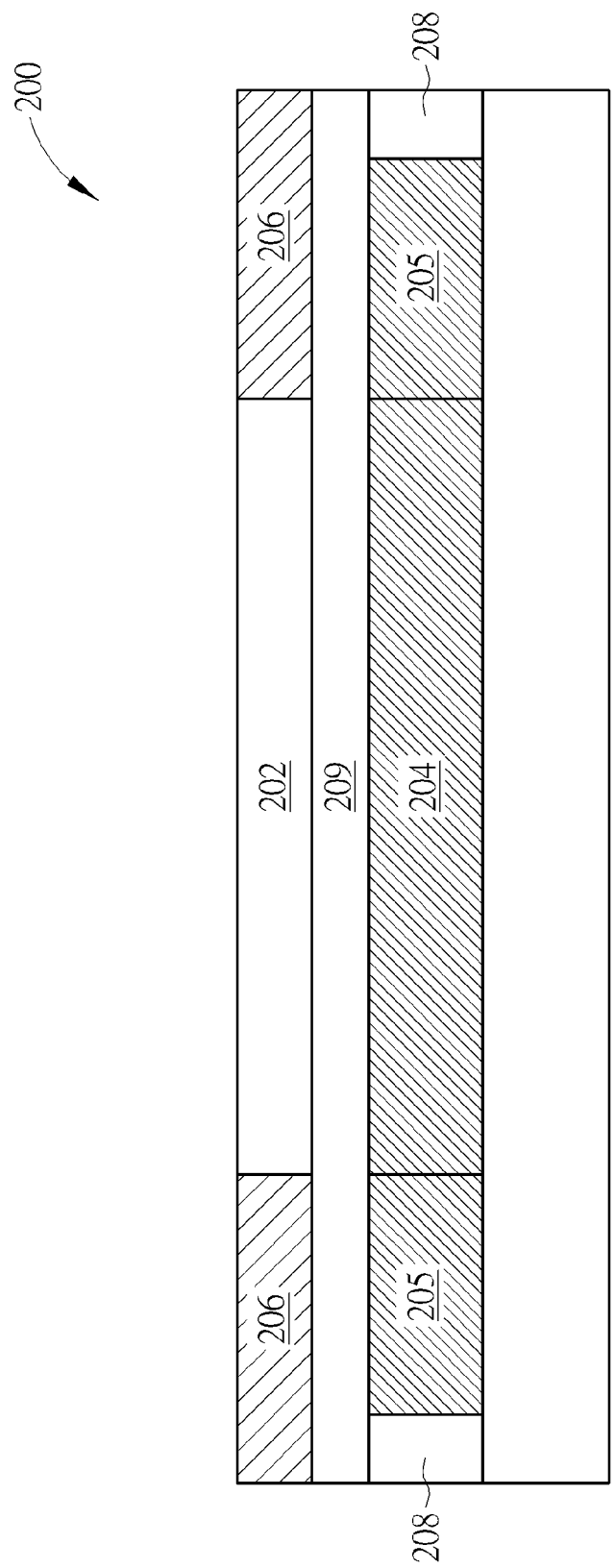
FIG. 2 is a simplified cross-sectional diagram of a semiconductor device according to a first exemplary embodiment of the present invention.
Figure 3:
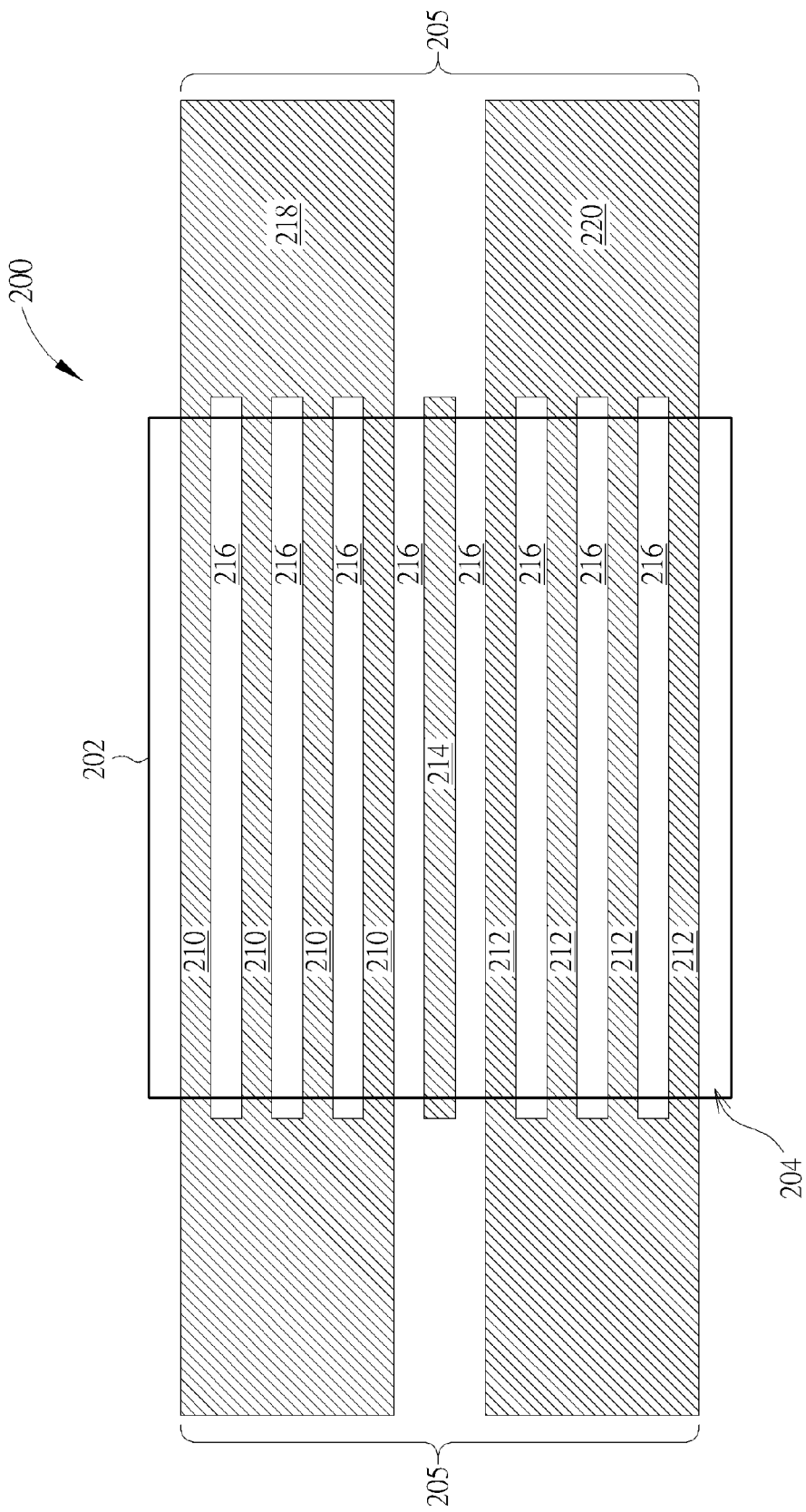
FIG. 3 is a simplified top-view diagram of the semiconductor device in FIG. 2.

Please refer to FIG. 2 and FIG. 3. FIG. 2 is a simplified cross-sectional diagram of a semiconductor device 200 according to a first exemplary embodiment of the present invention, and FIG. 3 is a simplified top-view diagram of the semiconductor device 200, where the semiconductor device 200 can be a chip. As shown in FIG. 2 and FIG. 3, the semiconductor device 200 may comprise a metal pad 202, a first specific metal layer routing 204, and a second specific metal layer routing 205. The metal pad 202 is positioned on a first metal layer 206 of the semiconductor device 200, where the metal pad 202 has a thickness smaller than 20 KA (i.e. 2 micrometers), and material of the metal pad 202 can be aluminum. The first specific metal layer routing 204 is formed on a second metal layer 208 of the semiconductor device 200, and directly under the metal pad 202. As shown in FIG. 2, the metal pad 202 may be regarded as a portion of the first metal layer 206, and the first specific metal layer routing 204 and the second specific metal layer routing 205 may be regarded as some portions of the second metal layer 208. In addition, please note that the above embodiment is only for an illustrative purpose and is not meant to be a limitation of the present invention. For example, the architecture shown in FIG. 2 can be changed according to different design requirements.

The first specific metal layer routing 204 has a uniform pattern, where the uniform pattern has a metal density range between 30% and 70%. Please note that if the metal density of the uniform pattern is higher than 70%, the first specific metal layer routing 204 under the metal pad 202 will fail. If the metal density of the uniform pattern is lower than 30%, it will be hard to design the first specific metal layer routing 204 under the metal pad 202. As shown in FIG. 3, the first specific metal layer routing 204 may comprise four first power lines 210, four first ground lines 212, and at least one unused metal line (e.g. one or more unused metal lines) such as the unused metal line 214 of this embodiment, where there are oxide regions 216 between the first power lines 210, the first ground lines 212, and the unused metal line 214, and each oxide region 216 can have a width greater than 2 micrometers. In addition, the unused metal line 214 is kept as a dummy pattern for robust bondability. The second specific metal layer routing 205 is formed on the second metal layer 208 of the semiconductor device 200 and connected to the first specific metal layer routing 204, where the second specific metal layer routing 205 is not positioned under the metal pad 202. The second specific metal layer routing 205 may comprise a second power line 218 and a second ground line 220. Please note that the first metal layer 206 and the second metal layer 208 are adjacent metal layers of the semiconductor device 200, and there is an oxide layer 209 between the first metal layer 206 and the second metal layer 208. In addition, please note that the above embodiment is only for an illustrative purpose and is not meant to be a limitation of the present invention. For example, the numbers of the first power lines 210, the first ground lines 212, and the unused metal line 214 can be changed according to different design requirements, respectively.

Briefly summarized, compared with prior art, since the semiconductor device disclosed by the present invention can allow the metal layer routing formed directly under the metal pad, the layout area size of the semiconductor device can be reduced effectively.

Figure 4:
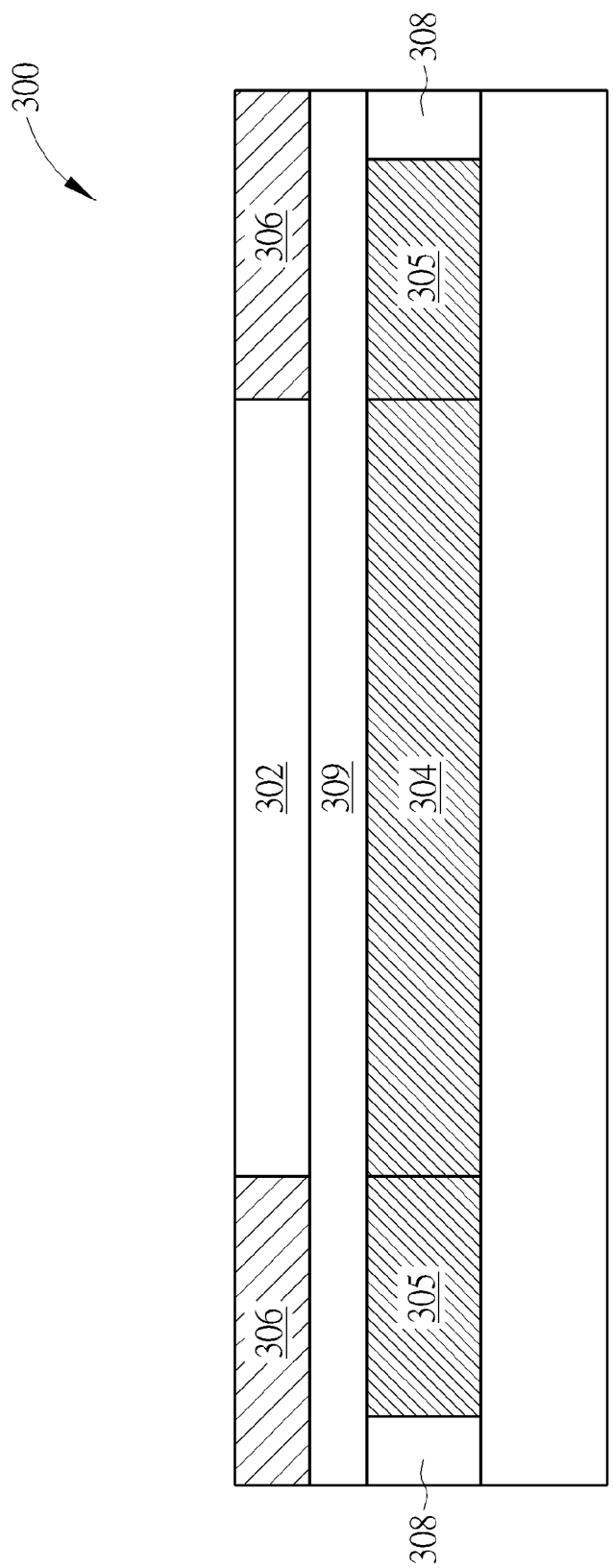
FIG. 4 is a simplified cross-sectional diagram of a semiconductor device according to a second exemplary embodiment of the present invention.
Figure 5:
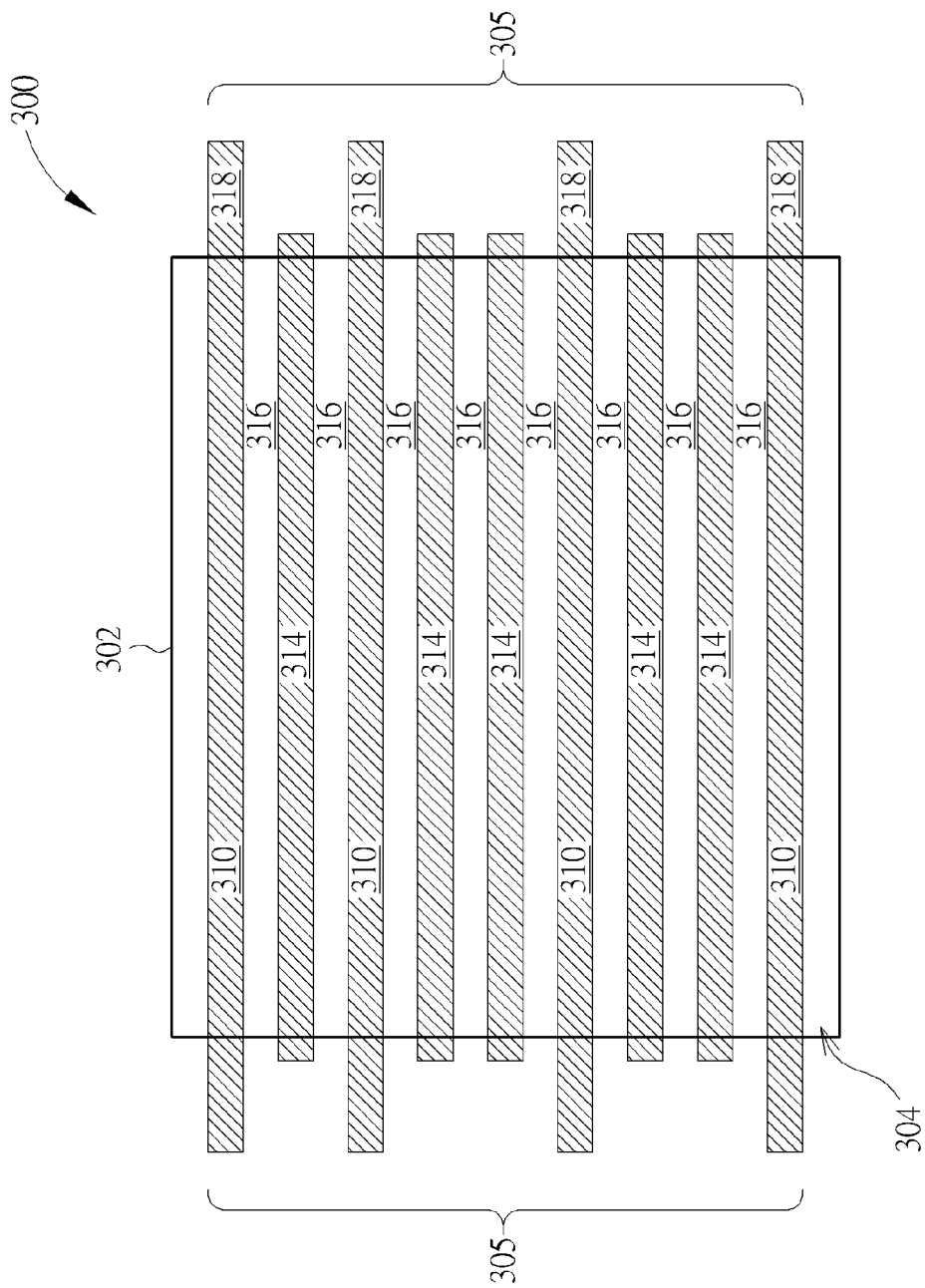
FIG. 5 is a simplified top-view diagram of the semiconductor device in FIG. 4.

Please refer to FIG. 4 and FIG. 5. FIG. 4 is a simplified cross-sectional diagram of a semiconductor device 300 according to a second exemplary embodiment of the present invention, and FIG. 5 is a simplified top-view diagram of the semiconductor device 300, where the semiconductor device 300 can be a chip. As shown in FIG. 4 and FIG. 5, the semiconductor device 300 may comprise a metal pad 302, a first specific metal layer routing 304, and a second specific metal layer routing 305. The metal pad 302 is positioned on a first metal layer 306 of the semiconductor device 300, where the metal pad 302 has a thickness smaller than 20 KA (i.e. 2 micrometers), and material of the metal pad 302 can be aluminum. The first specific metal layer routing 304 is formed on a second metal layer 308 of the semiconductor device 300, and directly under the metal pad 302. As shown in FIG. 4, the metal pad 302 may be regarded as a portion of the first metal layer 306, and the first specific metal layer routing 304 and the second specific metal layer routing 305 may be regarded as some portions of the second metal layer 308. In addition, please note that the above embodiment is only for an illustrative purpose and is not meant to be a limitation of the present invention. For example, the architecture shown in FIG. 4 can be changed according to different design requirements.

The first specific metal layer routing 304 has a uniform pattern, where the uniform pattern has a metal density range between 30% and 70%. Please note that if the metal density of the uniform pattern is higher than 70%, the first specific metal layer routing 304 under the metal pad 302 will fail. If the metal density of the uniform pattern is lower than 30%, it will be hard to design the first specific metal layer routing 304 under the metal pad 302. As shown in FIG. 5, the first specific metal layer routing 304 may comprise four first IO routing lines 310 and five unused metal lines 314, where there are oxide regions 316 between the first IO routing lines 310 and the unused metal lines 314, and each oxide region 316 can have a width greater than 3 micrometers. In addition, the unused metal lines 314 are kept as a dummy pattern for robust bondability. The second specific metal layer routing 305 is formed on the second metal layer 308 of the semiconductor device 300 and connected to the first specific metal layer routing 304, where the second specific metal layer routing 305 is not positioned under the metal pad 302. The second specific metal layer routing 305 may comprise four second IO routing lines 318, where the semiconductor device 300 may comprise at least one via plug (e.g. one or more via plugs) for connecting at least one portion (e.g. a portion or all) of the second IO routing lines 318 to other metal line(s) in other metal layer(s), such as a plurality of via plugs for connecting the second IO routing lines 318 to some other metal lines in one or more other metal layers, respectively. Please note that the first metal layer 306 and the second metal layer 308 are adjacent metal layers of the semiconductor device 300, and there is an oxide layer 309 between the first metal layer 306 and the second metal layer 308. In addition, please note that the above embodiment is only for an illustrative purpose and is not meant to be a limitation of the present invention. For example, the numbers of the first IO routing lines 310 and the unused metal lines 314 can be changed according to different design requirements, respectively.

Briefly summarized, compared with prior art, since the semiconductor device disclosed by the present invention can allow the metal layer routing formed directly under the metal pad, the layout area size of the semiconductor device can be reduced effectively.

Figure 6:
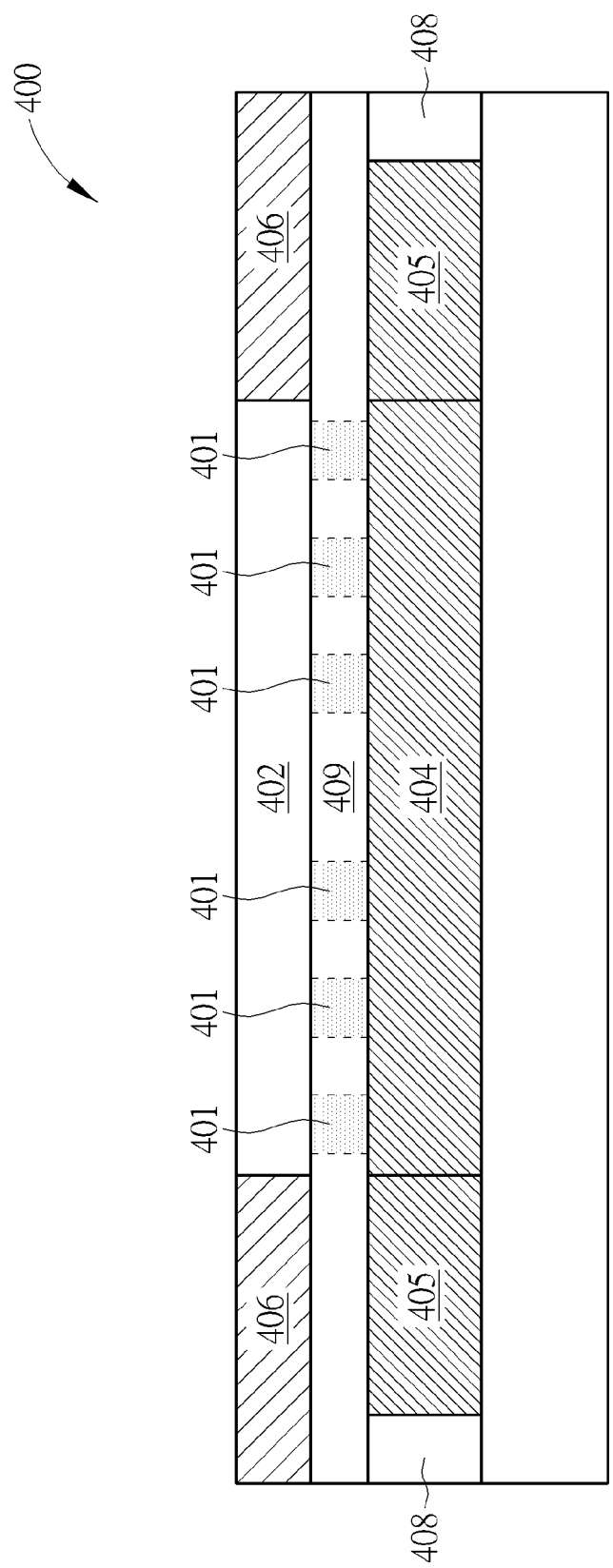
FIG. 6 is a simplified cross-sectional diagram of a semiconductor device according to a third exemplary embodiment of the present invention.
Figure 7:
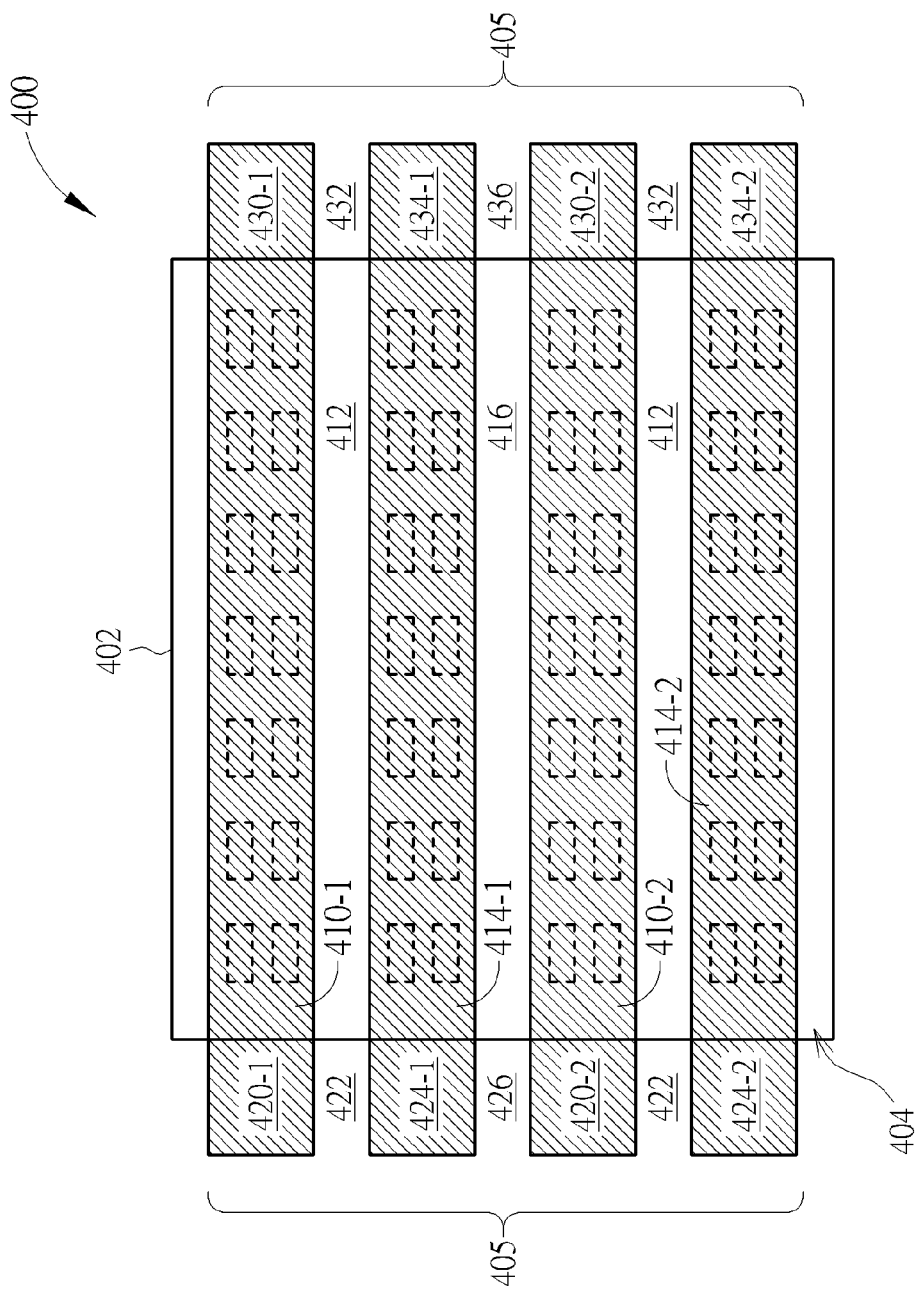
FIG. 7 is a simplified top-view diagram of the semiconductor device in FIG. 6.

Please refer to FIG. 6 and FIG. 7. FIG. 6 is a simplified cross-sectional diagram of a semiconductor device 400 according to a third exemplary embodiment of the present invention, and FIG. 7 is a simplified top-view diagram of the semiconductor device 400, where the semiconductor device 400 can be a chip. As shown in FIG. 6 and FIG. 7, the semiconductor device 400 may comprise a metal pad 402, a first specific metal layer routing 404, and a second specific metal layer routing 405. The metal pad 402 is positioned on a first metal layer 406 of the semiconductor device 400, where the metal pad 402 has a thickness smaller than 20 KA (i.e. 2 micrometers), and material of the metal pad 402 can be aluminum. The first specific metal layer routing 404 is formed on a second metal layer 408 of the semiconductor device 400 and under the metal pad 402. As shown in FIG. 6, the metal pad 402 may be regarded as a portion of the first metal layer 406, and the first specific metal layer routing 404 and the second specific metal layer routing 405 may be regarded as some portions of the second metal layer 408. In addition, the semiconductor device 400 may comprise at least one via plug (e.g. one or more via plugs) for connecting the first specific metal layer routing 404 to at least one metal region (e.g. one or more metal regions) in the first metal layer 406, where the aforementioned at least one via plug is formed directly under the metal pad 402. For example, the aforementioned at least one via plug may comprise multiple via plugs, such as a plurality of via plugs 401, directly under the metal pad 402, and the via plugs 401 may be utilized for connecting multiple portions of the first specific metal layer routing 404 to some metal regions in the first metal layer 406, respectively. Please note that the above embodiment is only for an illustrative purpose and is not meant to be a limitation of the present invention. For example, the architecture shown in FIG. 6 can be changed according to different design requirements. In some examples, the numbers of the via plugs 401 can be changed according to different design requirements.

The first specific metal layer routing 404 has a uniform pattern, where the uniform pattern has a metal density range between 30% and 70%. Please note that if the metal density of the uniform pattern is higher than 70%, the first specific metal layer routing 404 under the metal pad 402 will fail. If the metal density of the uniform pattern is lower than 30%, it will be hard to design the first specific metal layer routing 404 under the metal pad 402. As shown in FIG. 7, the first specific metal layer routing 404 may comprise a plurality of sets of terminal lines corresponding to terminals of a plurality of field effect transistors (FETs), respectively, such as the set of terminal lines {410-1, 414-1} and the set of terminal lines {410-2, 414-2}. For example, the terminal line 410-1 can be a source terminal line corresponding to the source terminal of a first FET within the plurality of FETs, and the terminal line 414-1 can be a drain terminal line corresponding to the drain terminal of the first FET. In addition, the terminal line 410-2 can be a source terminal line corresponding to the source terminal of a second FET within the plurality of FETs, and the terminal line 414-2 can be a drain terminal line corresponding to the drain terminal of the second FET. In some embodiments, the arrangement of the plurality of sets of terminal lines may vary. For example, the terminal line 414-1 can be a source terminal line corresponding to the source terminal of the first FET within the plurality of FETs, and the terminal line 410-1 can be a drain terminal line corresponding to the drain terminal of the first FET. In addition, the terminal line 414-2 can be a source terminal line corresponding to the source terminal of the second FET within the plurality of FETs, and the terminal line 410-2 can be a drain terminal line corresponding to the drain terminal of the second FET.

According to the embodiment shown in FIG. 7, the small boxes illustrated with dashed lines can be taken as examples of the via plugs 401, and the via plugs 401 may be positioned between the metal pad 402 and the plurality of sets of terminal lines (e.g. the set of terminal lines {410-1, 414-1} and the set of terminal lines {410-2, 414-2}). As shown in FIG. 7, there may be at least one oxide region (e.g. one or more oxide regions) between the plurality of sets of terminal lines, such as the oxide regions 416 between the set of terminal lines {410-1, 414-1} and the set of terminal lines {410-2, 414-2} in this embodiment, and each oxide region of the aforementioned at least one oxide region, such as the oxide region 416 has a width greater than 2 micrometers. For example, there is an oxide region 412 between the source terminal line and the drain terminal line of each set of the plurality of sets of terminal lines, and the oxide region 412 has a width greater than 2 micrometers. In addition, the second specific metal layer routing 405 is formed on the second metal layer 408 of the semiconductor device 400 and connected to the first specific metal layer routing 404, where the second specific metal layer routing 405 is not positioned under the metal pad 402. The second specific metal layer routing 405 may comprise a plurality of sets of terminal lines corresponding to the plurality of sets of terminal lines of the first specific metal layer routing 404, respectively. Examples of the plurality of sets of terminal lines of the second specific metal layer routing 405 may include, but not limited to, the set of terminal lines {420-1, 424-1}, the set of terminal lines {420-2, 424-2}, the set of terminal lines {430-1, 434-1}, and the set of terminal lines {430-2, 434-2}. In this embodiment, the plurality of sets of terminal lines of the second specific metal layer routing 405 may be regarded as extensions of the plurality of sets of terminal lines of the first specific metal layer routing 404, respectively, where the width of the terminal lines, the width of the gap between adjacent sets of terminal lines, and the width of the gap between the terminal lines in each set of terminal lines may be kept constant, no matter whether the terminal lines are under the metal pad 402 or not. Please note that the first metal layer 406 and the second metal layer 408 are adjacent metal layers of the semiconductor device 400, and there is an oxide layer 409 between the first metal layer 406 and the second metal layer 408. For example, the via plugs 401 may pass through the oxide layer 309. In addition, please note that the above embodiment is only for an illustrative purpose and is not meant to be a limitation of the present invention. For example, the numbers of sets of terminal lines can be changed according to different design requirements.

Briefly summarized, compared with prior art, since the semiconductor device disclosed by the present invention can allow the metal layer routing formed directly under the metal pad, the layout area size of the semiconductor device can be reduced effectively.

According to some embodiments, at least one size of at least one side of the aforementioned at least one via plug (e.g. one or more via plugs, such as the via plugs 401) is not less than 1 micrometer. For example, each of the via plugs 401 may be implemented to have a conduction area such as 1 micrometer by 1 micrometer, to allow currents to pass through the via plugs 401 (e.g. from the metal pad 402 to the first specific metal layer routing 404, or from the first specific metal layer routing 404 to the metal pad 402) without damaging the via plugs 401, and the number of via plugs within the via plugs 401 may be very great, to achieve a predetermined percentage of the area under the metal pad 402, where they may be widely and uniformly distributed, under the metal pad 402. This is only for an illustrative purpose and is not meant to be a limitation of the present invention. According to some embodiments, the size of a first side of the aforementioned at least one via plug (e.g. one or more via plugs, such as the via plugs 401) is not less than 1 micrometer, and the size of a second side of the aforementioned at least one via plug (e.g. one or more via plugs, such as the via plugs 401) is not less than 3 micrometers. For example, each of the via plugs 401 may be implemented to have a conduction area such as 1 micrometer by 3 micrometers, to allow currents to pass through the via plugs 401 (e.g. from the metal pad 402 to the first specific metal layer routing 404, or from the first specific metal layer routing 404 to the metal pad 402) without damaging the via plugs 401.

According to some embodiments, as the multiple via plugs such as the via plugs 401 are implemented directly under the metal pad 402, some implementation parameters regarding the terminal lines may be kept constant, no matter whether the terminal lines are under the metal pad 402 or not. Examples of these implementation parameters regarding the terminal lines may include, but not limited to, the width of the terminal lines, the width of the gap between adjacent sets of terminal lines, and the width of the gap between the terminal lines in each set of terminal lines.

Figure 8:
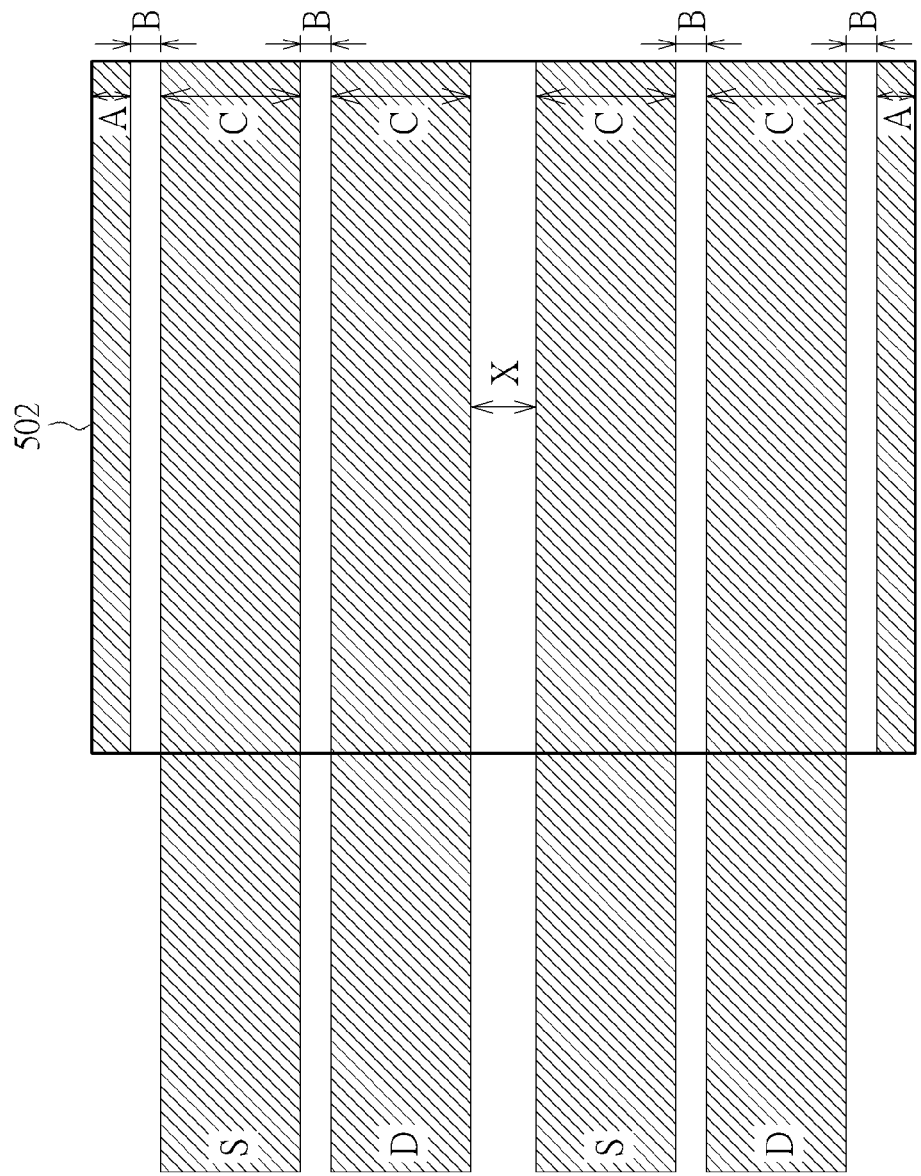
FIG. 8 is a simplified top-view diagram of a semiconductor device according to a fourth exemplary embodiment of the present invention.

FIG. 8 is a simplified top-view diagram of a semiconductor device according to a fourth exemplary embodiment of the present invention, where the semiconductor device of this embodiment can be taken as an example of the semiconductor device 400 shown in FIG. 7, and the metal pad 502 can be taken as an example of the metal pad 402 described above. For brevity, the number of sets of terminal lines under the metal pad 502 may be two as illustrated in FIG. 7. Please note that the above embodiment is only for an illustrative purpose and is not meant to be a limitation of the present invention.

According to this embodiment, the terminal lines S can be taken as an example of the source terminal line corresponding to the source terminal of one of the FETs, and the terminal lines D can be taken as an example of the drain terminal line corresponding to the drain terminal of one of the FETs. Please note that the width C of the terminal lines, the width X of the gap between adjacent sets of terminal lines, and the width B of the gap between the terminal lines in each set of terminal lines may be kept constant, no matter whether the terminal lines are under the metal pad 502 or not. In addition, the first specific metal layer routing 404 of this embodiment may comprise at least one unused metal line (e.g. one or more unused metal lines) such as the two unused metal lines having the width A. For example, the aforementioned at least one unused metal line such as the two unused metal lines may be kept as a dummy pattern for robust bondability. For brevity, similar descriptions for this embodiment are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a metal pad, positioned on a first metal layer of the semiconductor device and directly contacting the first metal layer;
   a first specific metal layer routing, formed on a second metal layer of the semiconductor device and under the metal pad; and
   at least one via plug for connecting the first specific metal layer routing to at least one metal region in the first metal layer, wherein the via plug is formed directly under the metal pad.

2. The semiconductor device of claim 1, wherein the metal pad has a thickness smaller than 20 KA.

3. The semiconductor device of claim 1, wherein material of the metal pad is aluminum.

4. The semiconductor device of claim 1, wherein the first specific metal layer routing has a uniform pattern.

5. The semiconductor device of claim 4, wherein the uniform pattern has a metal density range between 30% and 70%.

6. The semiconductor device of claim 1, wherein the first specific metal layer routing comprises a plurality of sets of terminal lines corresponding to terminals of a plurality of field effect transistors (FETs), respectively.

7. The semiconductor device of claim 6, wherein there are oxide regions between the plurality of sets of terminal lines, and each oxide region has a width greater than 2 micrometers.

8. The semiconductor device of claim 6, wherein a set of terminal lines within the plurality of sets of terminal lines comprises a source terminal line and a drain terminal line respectively corresponding to a source terminal and a drain terminal of a FET within the plurality of FETs.

9. The semiconductor device of claim 8, wherein there is an oxide region between the source terminal line and the drain terminal line, and the oxide region has a width greater than 2 micrometers.

10. The semiconductor device of claim 1, further comprising:
    a second specific metal layer routing, formed on the second metal layer of the semiconductor device and connected to the first specific metal layer routing, wherein the second specific metal layer routing is not directly positioned under the metal pad.

11. The semiconductor device of claim 10, wherein the first specific metal layer routing comprises a plurality of sets of terminal lines corresponding to terminals of a plurality of field effect transistors (FETs), respectively; and the second specific metal layer routing comprises a plurality of sets of terminal lines corresponding to the plurality of sets of terminal lines of the first specific metal layer routing, respectively.

12. The semiconductor device of claim 11, wherein the plurality of sets of terminal lines of the second specific metal layer routing are extensions of the plurality of sets of terminal lines of the first specific metal layer routing, respectively.

13. The semiconductor device of claim 1, wherein the semiconductor device is a chip.

14. The semiconductor device of claim 1, wherein the first metal layer and the second metal layer are adjacent metal layers of the semiconductor device.

15. The semiconductor device of claim 1, wherein at least one size of at least one side of the at least one via plug is not less than 1 micrometer.

16. The semiconductor device of claim 15, wherein a size of a first side of the at least one via plug is not less than 1 micrometer, and a size of a second side of the at least one via plug is not less than 3 micrometers.

17. The semiconductor device of claim 1, wherein the at least one via plug comprises multiple via plugs, directly under the metal pad.

* * * * *